(12) United States Patent
Premerlani et al.

(10) Patent No.: US 7,180,300 B2
(45) Date of Patent: Feb. 20, 2007

(54) SYSTEM AND METHOD OF LOCATING GROUND FAULT IN ELECTRICAL POWER DISTRIBUTION SYSTEM

(75) Inventors: William James Premerlani, Scotia, NY (US); Rui Zhou, Clifton Park, NY (US); Yan Liu, Niskayuna, NY (US); Thomas Federick Papallo, Jr., Farmington, CT (US); Gregory Paul Lavoie, Bristol, CT (US); Marcelo Esteban Valdes, Burlington, CT (US); Michael Gerard Pintar, Burlington, IA (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 11/009,111

(22) Filed: Dec. 10, 2004

(65) Prior Publication Data

US 2006/0125486 A1 Jun. 15, 2006

(51) Int. Cl.
*G01R 31/08* (2006.01)
*G01R 31/14* (2006.01)
*H02H 3/00* (2006.01)

(52) U.S. Cl. .................. 324/512; 324/509; 324/527; 361/64

(58) Field of Classification Search ............. 324/512, 324/500, 519, 527, 509, 528, 523, 531, 533, 324/541, 544; 361/64
See application file for complete search history.

(56) References Cited

U.S. PATENT DOCUMENTS

| | | | | |
|---|---|---|---|---|
| 3,916,752 A | * | 11/1975 | Kawamoto et al. ............ 84/685 |
| 4,021,729 A | * | 5/1977 | Hudson, Jr. .................. 324/509 |
| 4,151,460 A | | 4/1979 | Seese et al. .................... 324/52 |
| 4,206,398 A | * | 6/1980 | Janning ........................ 324/509 |
| 4,440,985 A | * | 4/1984 | Federico et al. ............ 379/22.08 |
| 4,638,245 A | * | 1/1987 | MacPhee et al. ............. 324/519 |
| 4,797,805 A | * | 1/1989 | Nimmersjo .................... 702/59 |
| 4,800,509 A | | 1/1989 | Nimmersjo ................... 364/492 |
| 4,821,137 A | * | 4/1989 | Wilkinson ..................... 361/80 |
| 5,402,071 A | * | 3/1995 | Bastard et al. ............... 324/509 |

(Continued)

FOREIGN PATENT DOCUMENTS

DE 10151160 5/2003

(Continued)

OTHER PUBLICATIONS

Schweer; Détection et localization des défauts à la terre; XP 000555093 Dossier; pp. 76-80.

*Primary Examiner*—Vincent Q. Nguyen
*Assistant Examiner*—Hoai-An D. Nguyen
(74) *Attorney, Agent, or Firm*—Fletcher Yoder (57) ABSTRACT

A method for locating a ground fault in an electrical power distribution system includes providing a plurality of current sensors at a plurality of locations in the electrical power distribution system. The method further includes detecting a ground fault in the electrical power distribution system. Current is monitored at a plurality of locations in the electrical power distribution system via the current sensors and a test signal is introduced into the electrical power distribution system via a test signal generating device. The plurality of locations are monitored to locate the ground fault between a location at which the test signal is detected and a downstream location at which the test signal is not detected.

17 Claims, 6 Drawing Sheets

U.S. PATENT DOCUMENTS

| | | | |
|---|---|---|---|
| 5,428,295 A | 6/1995 | Beeman | 324/529 |
| 5,495,384 A | 2/1996 | Wallis et al. | |
| 5,798,932 A * | 8/1998 | Premerlani et al. | 702/59 |
| 6,154,036 A * | 11/2000 | Baldwin | 324/509 |
| 6,292,541 B1 * | 9/2001 | Tice et al. | 379/22.03 |
| 6,426,634 B1 * | 7/2002 | Clunn et al. | 324/536 |
| 6,573,726 B1 * | 6/2003 | Roberts et al. | 324/509 |
| 6,718,271 B1 * | 4/2004 | Tobin | 702/58 |
| 6,734,682 B2 * | 5/2004 | Tallman et al. | 324/528 |
| 6,856,137 B2 * | 2/2005 | Roden et al. | 324/509 |

FOREIGN PATENT DOCUMENTS

| | | |
|---|---|---|
| DE | 10215025 | 10/2003 |
| EP | 1589345 | 10/2005 |
| EP | 1593983 | 11/2005 |
| WO | WO0215355 | 2/2002 |

* cited by examiner

SYSTEM AND METHOD OF LOCATING GROUND FAULT IN ELECTRICAL POWER DISTRIBUTION SYSTEM

BACKGROUND

The present invention relates generally to detection and location of ground faults in electrical power distribution systems, and more specifically to a technique for detecting and locating phase-to-ground faults in high resistance grounded power systems.

A ground fault is an undesirable condition in an electrical system, in which electrical current flows to the ground. A ground fault happens when the electrical current in a distribution or transmission network leaks outside of its intended flow path. Distribution and transmission networks are generally protected against faults in such a way that a faulty component or transmission line is automatically disconnected with the aid of an associated circuit breaker.

One grounding strategy for low voltage power systems is high resistance grounding. In high resistance grounded power systems, an impedance is provided between the neutral and ground of a source power transformer. This high resistance grounding allows continued operation of the power system even in case of single phase-to-ground fault. However, depending upon the system design, to permit such continued operation, the ground fault should be detected and located to relieve the extra voltage stress in the power system and also to remove the initial fault to eliminate the occurrence of series of faults from phase to phase.

Hand held sensors have been used to trace a fault in power systems. Conventionally, either a signal is injected at the grounding impedance or a portion of the grounding impedance is periodically partially shorted via a contactor. This produces a zero sequence current in the power system that can be traced using the hand held sensor. The hand held sensor must typically be placed encircling all the conductors at a selected measurement point in the power system, to indicate whether the measurement point is between the grounding impedance and location of the ground fault. The hand held sensor is moved from one point to another in the power system until the fault is located in this manner. The process is, however, time consuming and labor-intensive.

Accordingly, there is a need for a relatively straightforward and automated process for detecting and locating ground faults in an electrical power distribution system.

BRIEF DESCRIPTION

Briefly, in accordance with one aspect of the present technique, a method for locating a ground fault in an electrical power distribution system is provided. The method includes providing a plurality of current sensors at a plurality of locations in the electrical power distribution system. The method further includes detecting a ground fault in the electrical power distribution system. Current is monitored at the plurality of locations in the electrical power distribution system via the current sensors and a test signal is introduced into the electrical power distribution system via a test signal generating device. The plurality of locations are monitored to locate the ground fault between a location at which the test signal is detected and a downstream location at which the test signal is not detected.

In accordance with another aspect of the present technique, a system for locating a ground fault in an electrical power distribution system is provided. The system includes a plurality of current sensors adapted to monitor current at a plurality of locations in the distribution system. A test signal generating device is configured to introduce a test signal into the distribution system. A processor is configured to receive signals from the current sensors to identify a location of the ground fault between a location at which the test signal is detected and a downstream location at which the test signal is not detected.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
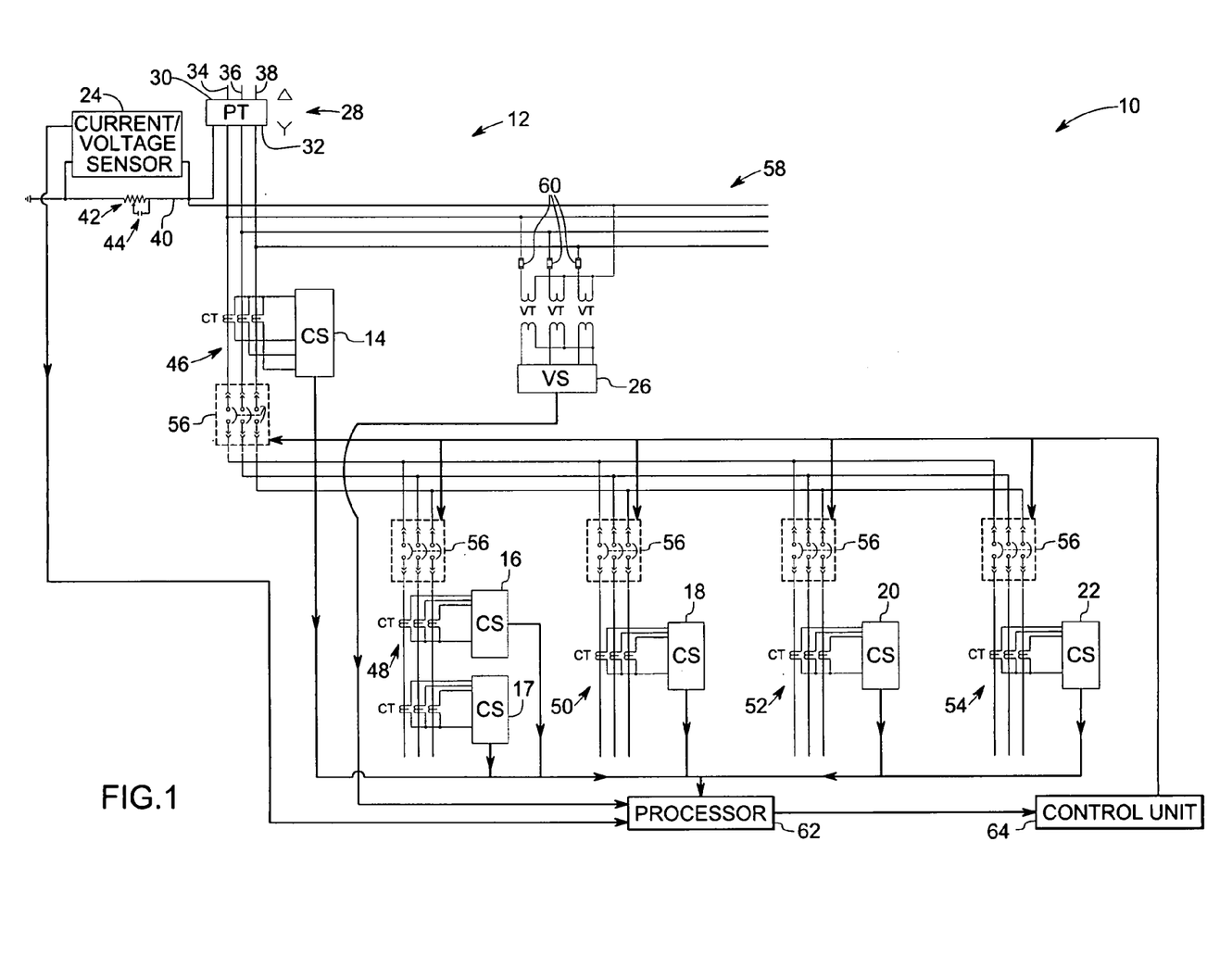
FIG. 1 is a diagrammatical view of a system for locating a ground fault in a three phase high resistance grounded power distribution system.

Referring now to FIG. 1, a ground fault locating system 10 is illustrated for a three phase high resistance grounded power distribution system 12. The system 10 includes a plurality of current sensors 14, 16, 17, 18, 20, 22 and a plurality of voltage sensors 24, 26 coupled to the three phase power distribution system 12, for measuring values for the instantaneous current and the instantaneous voltage respectively. In one exemplary embodiment, the current sensors 14, 16, 17, 18, 20, 22 are current transformers configured to generate feedback signals representative of instantaneous current through each phase. Similarly, the voltage sensor 26 is a voltage transformer adapted to measure instantaneous voltage from phase to neutral. Other types of current and voltage sensors may, of course, be employed.

In the illustrated embodiment, the system 12 includes a power transformer 28 having an input side 30 and an output side 32. The power transformer 28 comprises three phases i.e. a first phase 34, a second phase 36, and a third phase 38 coupled, in this example, in delta configuration at the input side 30 and wye configuration at the output side 32. A neutral line 40 at the output side 32 of the power transformer 28 is grounded via a grounding resistor 42. The grounding resistor 42 is configured to reduce the ground fault current, so that the system 12 could remain in operation while the fault is being located. In the illustrated embodiment, the voltage sensor 24 is coupled across the neutral grounding resistor 42 and configured to measure the neutral to ground voltage across the neutral grounding resistor 42. In another embodiment, the sensor 24 is a current sensor and configured to measure the current flowing through the neutral grounding resistor 42.

A test signal generating device 44 is coupled across the grounding resistor 42 and configured to introduce a test signal into the system 12. In one example, the test signal is a pulse signal generated at desired intervals. In another example, the test signal is a tone signal at a frequency other than a frequency of current distributed by the system 12. In the illustrated embodiment, the test signal generating device 44 is a switch provided to generate a pulse signal in the system 12. The grounding resistor 42 is periodically partially shorted by closing the switch 44 to generate the pulse signal at desired intervals. In another embodiment, the test signal generating device 44 is a current source configured to inject a zero sequence current at a frequency other than the fundamental frequency of current into the system 12.

As illustrated, the three phases 34, 36, 38 of the power transformer 28 are coupled to a plurality of three phase distribution networks 46, 48, 50, 52, 54. In the illustrated embodiment, the current sensors 14, 18, 20 22 are coupled to the distribution networks 46, 50, 52, and 54 respectively. The current sensors 16, 17 are coupled to the distribution network 48. In other embodiments, any number of current sensors are envisaged to accurately locate the ground fault in the system 12. As appreciated by those skilled in the art, each distribution network is provided with a circuit breaker 56, as well as other protective devices, where appropriate. Also illustrated is another distribution network 58 coupled to the power transformer 28. The voltage sensor 26 is coupled via a set of fuses to the distribution network 58. As appreciated by those skilled in the art, the fuses 60 limit current to the voltage sensor 26. The voltage sensor 26 is configured to measure the phase to neutral voltage in the system 12.

The analog signals from the current sensors 14, 16, 17, 18, 20, 22 and the voltage sensors 24, 26 are converted into digital signals and applied to a processor 62. As known to those skilled in the art, an analog-to-digital converter may be used to convert the analog signal to a digital value that can be read by the processor 62. As discussed below, the monitored current values are processed through phasor analysis to remove capacitive currents that are out of phase with current through the neutral grounding resistor 42 of the power transformer 28. When present, a ground fault is located between a location at which test signal is detected and a downstream location at which test signal is not detected in the system 12. Processor 62 will typically include hardware circuitry and software for performing computations indicative of ground fault condition as described below. Processor 62 may thus include a range of devices, such as a microprocessor based module, an application-specific or general purpose computer, programmable logic controller, or a logical module, as well as appropriate programming code within such devices.

The processor 62 is coupled to a control unit 64 configured to receive the data from the processor 62 and initiate a protective action based on the data from the processor 62. The control unit 64 is communicatively coupled to a plurality of contactors, circuit interrupters or power circuit breakers 56 provided to the distribution networks 46, 48, 50, 52, and 54. When a ground fault is detected in a particular circuit, the control unit 64 opens the circuit corresponding to the fault to cut off power supply through the fault, or initiates an alarm.

Figure 2:
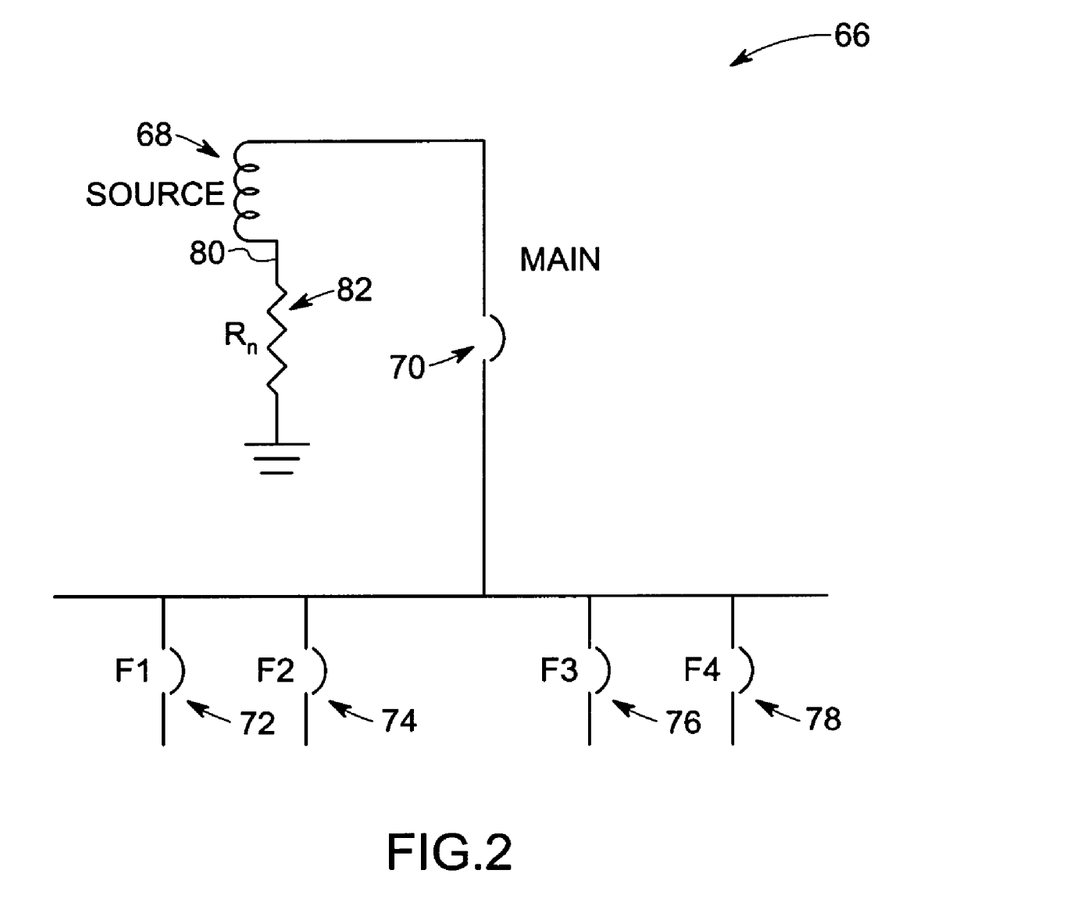
FIG. 2 is a diagrammatical view of a high resistance grounded system.

FIG. 2 shows an embodiment of a single ended high resistance grounded system 66. In the illustrated embodiment, the high resistance grounded system 66 includes a substation transformer 68, a main breaker 70 and a plurality of feeder breakers 72, 74, 76, 78. A neutral line 80 of the substation transformer 68 is grounded via a grounding resistor 82. As discussed above, when there is an occurrence of a ground fault in the system 66, the grounding resistor 82 limits the fault current, resulting in the collapse of the phase-to-ground voltage in the faulted phase.

Figure 3:
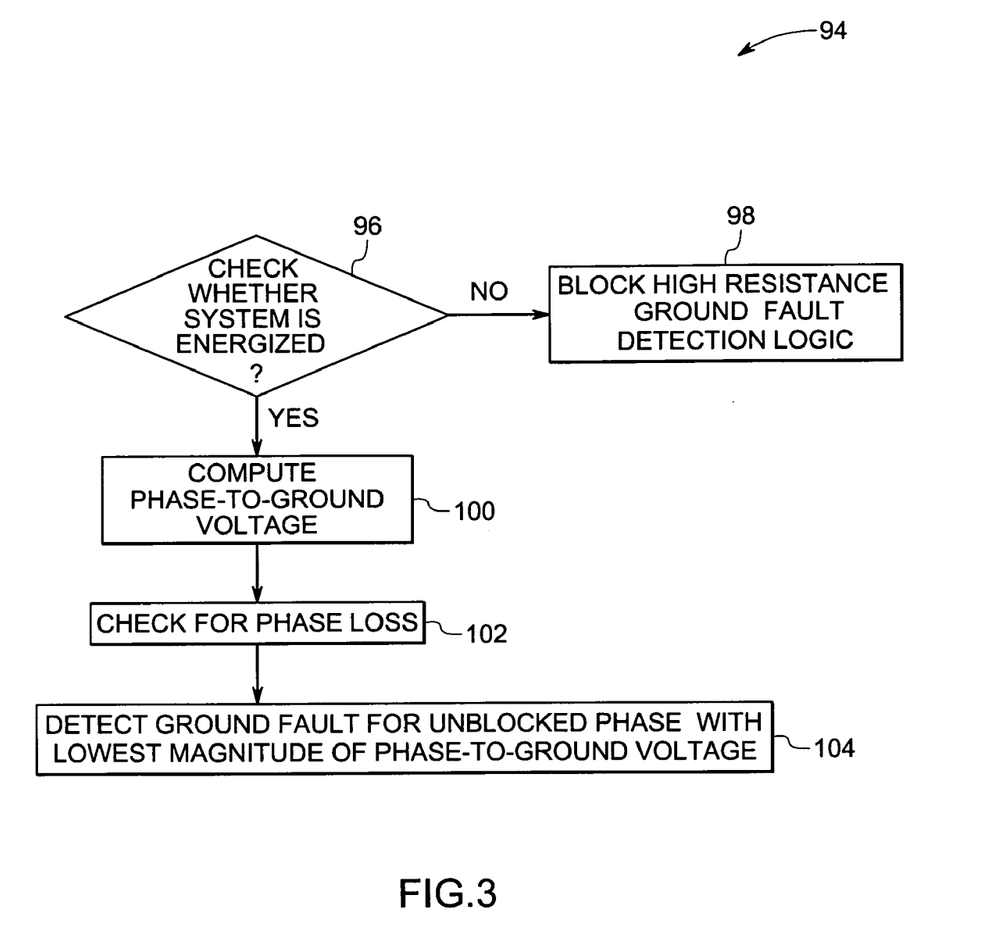
FIG. 3 is a flow chart illustrating exemplary steps involved in fault detection and phase identification via a system of the type shown in FIG. 1.

FIG. 3 is a flow chart illustrating exemplary steps involved in fault detection and phase identification via a system of the type shown in FIG. 1 and represented generally by reference numeral 94. In the illustrated embodiment, the general fault detection and phase identification, begins with checking the distribution system to determine whether the system is energized as indicated by step 96. If the system is not energized, high resistance ground fault detection logic is blocked as indicated by block 98. At step 100, phase-to-ground voltages are computed from phase-to-neutral voltages and neutral-to-ground voltage by simply adding phase-to-neutral voltages to neutral-to-ground voltage. With reference to FIG. 1 previously described, in one embodiment, the phase-to-neutral voltage is measured by the voltage sensor 26 and the neutral-to-ground voltage across the neutral grounding resistor 42 is measured by the voltage sensor 24. In another embodiment, current through the neutral grounding resistor 42 is measured by the current sensor and neutral-to-ground voltage is computed based on the current through the grounding resistor 42 and the value of resistance of the resistor 42.

At step 102, individual phases of the system are checked for phase loss by detecting phase-to-neutral voltage. The phase loss is determined based on the following relation:

$$|V_{phase\text{-}neutral}| < PL \times V_{basis}$$

where PL=phase loss detection setting (0<PL<1); and $V_{basis}$ is the phasor value of the nominal phase-to-neutral voltage. At step 104, the ground fault condition is checked for the unblocked phase with the lowest magnitude of phase-to-ground voltage. The ground fault condition is checked based on the following relationship:

$$|V_{phase\text{-}gnd}| < G \times V_{basis}$$

where G is the ground fault detection setting (0<G<1).

The ground fault detection algorithm may be also used to detect an inverted ground fault condition in which high voltage is generated across the unfaulted phases. The inverted ground fault is checked based on the following relationship:

$$|V_{phase\text{-}gnd}| > INV \times V_{basis};$$

where INV is the inverse ground fault detection setting; and $$\sqrt{3} < INV < \frac{3}{2} \times \sqrt{3}.$$

Although the ground fault detection algorithm is applied for single ended system, the algorithm may be used for multi-ended systems. Each source transformer of the multi-ended system is separately grounded through a resistor and a plurality of ground points are coupled together by a ground bus via appropriate switchgear. If the plurality of phase conductors of the multi-ended systems are coupled together, current through the two grounding resistors contribute to the ground fault.

Figure 4:
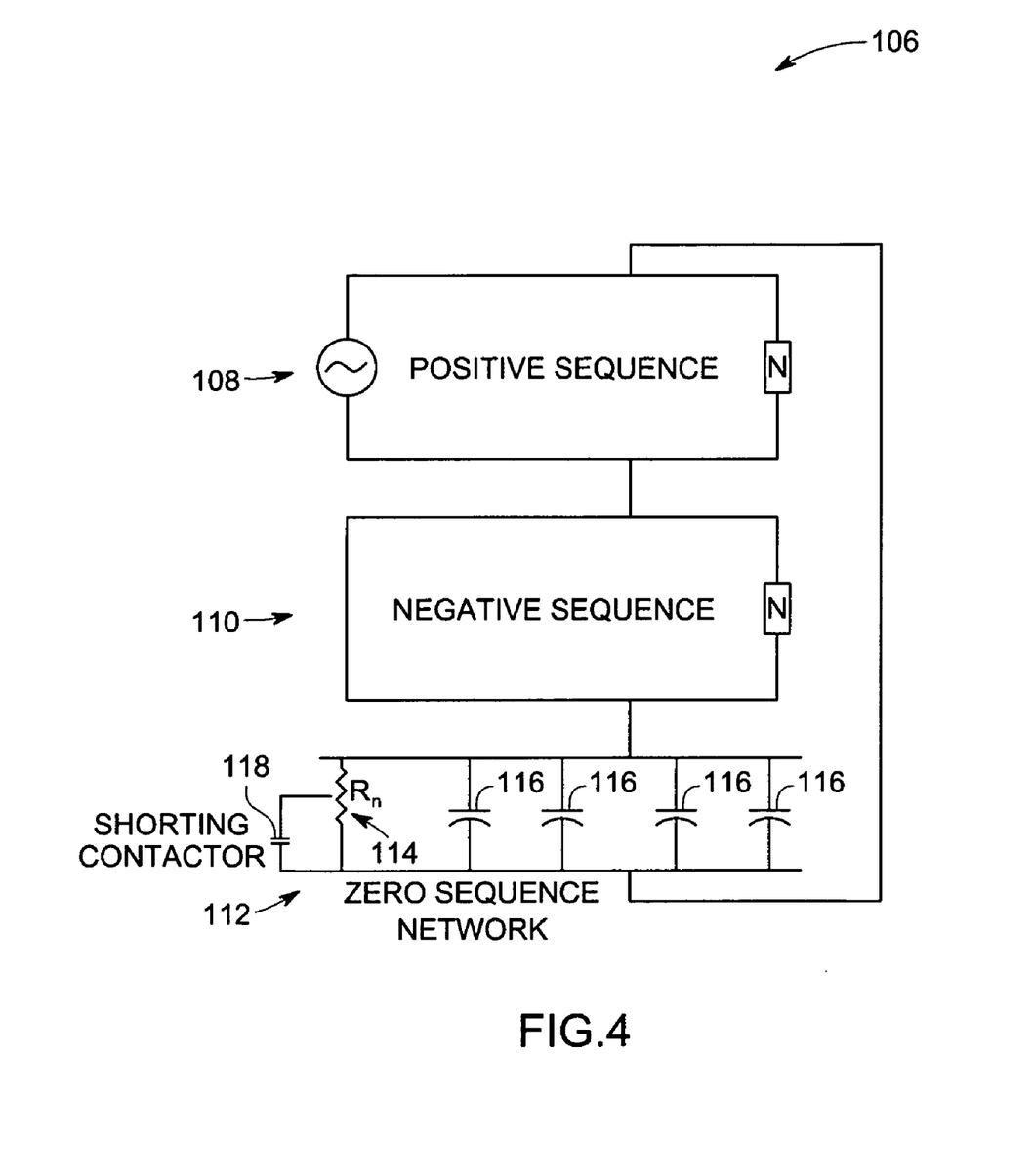
FIG. 4 is a diagrammatical view of a sequence component equivalent of a faulted high resistance grounded power system at the fundamental frequency.

FIG. 4 is a diagrammatical illustration of a sequence component equivalent circuit at the fundamental frequency that can be used to understand the high resistance grounded location network 106. As will be appreciated by those skilled in the art, the network 106 includes a positive sequence network 108, a negative sequence network 110, and a zero sequence network 112. The zero sequence network 112 includes a grounding resistor 114 and a plurality of charging capacitances 116. A shorting contactor 118 is provided across the grounding resistor 114. In the illustrated network 106, because a reduced amount of fault current flows through the network 106, the voltage drop across the network components is negligible. As a result, all the voltage is generated across the grounding resistor 114 and the charging capacitances 116. The zero sequence network 112 yields fault location information because there are no shunt connections other than the charging capacitances 116 and the grounding resistor 114.

In the zero sequence network 112, the fault current includes two mutually perpendicular phasor components, i.e. current through the grounding resistor 114 and the current through the charging capacitances 116. The zero sequence current through the resistor 114 flows back from the location of fault to the grounding resistor 114. Periodic shorting of a portion of the grounding resistor 114 via the contactor 118 will cause the zero sequence current between the location of fault and the resistor 114 to toggle. The zero sequence current flowing through the charging capacitances 116 is distributed throughout the network 106 and hence absorbed by the distributed capacitances 116. The ground fault is located by tracing a pulsing current that flows when a portion of the grounding resistor is periodically partially shorted. The pulsing zero sequence current will flow between the grounding resistor 114 and the location of the fault. The zero sequence current transformer enables detection of the pulsing residual current. The technique may be used to detect ground faults in a wide range of equipments, systems, installations and facilities, including substations, main breakers, feeder breakers or the like. In general, for installations in which sensors are provided in or near breakers in the circuitry, the ground fault is located at a downstream location of breakers that detect a pulsing current.

The effect of errors such as charging current and unbalance are reduced by subtracting the phasor value of the zero sequence current when the contactor 118 is open from the phasor value of the zero sequence current when the contactor 118 is closed. When the magnitude of the difference in phasor value exceeds a threshold value, the pulsing current is located at a particular location. The threshold value is set sufficiently high to reject noise, but sufficiently low to detect the amplitude of the pulsing current. In the illustrated embodiment, the zero sequence current is equal to the phase-to-neutral voltage divided by three times the grounding resistance. The residual current is the sum of the three phase current, which is three times the zero sequence current. As a result, the residual current is equal to the phase-to-neutral voltage divided by the value of the neutral grounding resistance.

Figure 5:
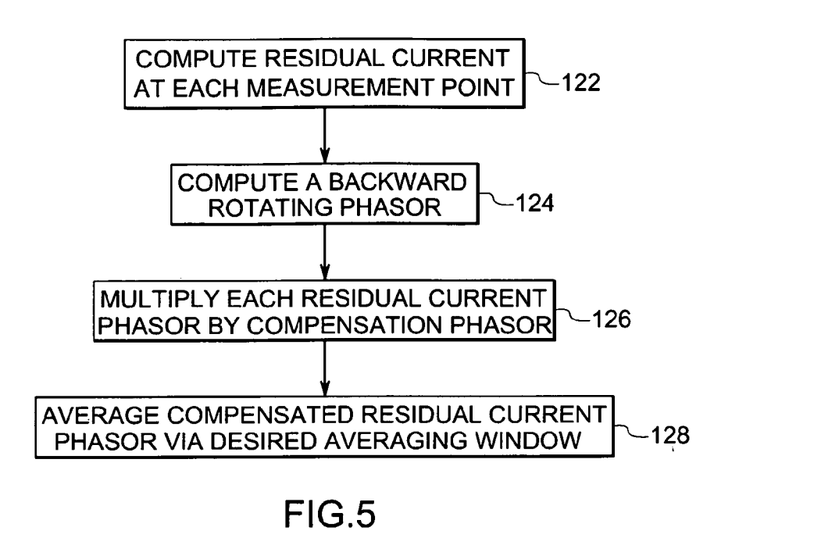
FIG. 5 is a flow chart illustrating exemplary steps involved in computing the average phasor values of pulsing residual current.

FIG. 5 is a flow chart illustrating exemplary steps involved in computing the average phasor values of pulsing residual current. In the illustrated embodiment, the computation 120 begins with computing the residual current at each measurement point in the system, by adding the three phasor values of the three phase currents as illustrated in step 122. At step 124, the phasor value of the current through, or the voltage across, the neutral grounding resistor is computed. The phasor value of the current is converted into a rotation compensation phasor by dividing the complex conjugate of the phasor by its magnitude. As a result, a backward rotating phasor with unit magnitude is produced. At step 126, each residual current phasor is multiplied by the computed compensation phasor. At step 128, the average of the compensated residual current phasors is computed over a desired averaging window, such as 60 cycles. The effective resolution is improved by computing the average phasor values over the desired time window. In the illustrated embodiment, the improvement in signal-to-noise ratio due to quantization error is proportional to the square root of the time window.

Figure 6:
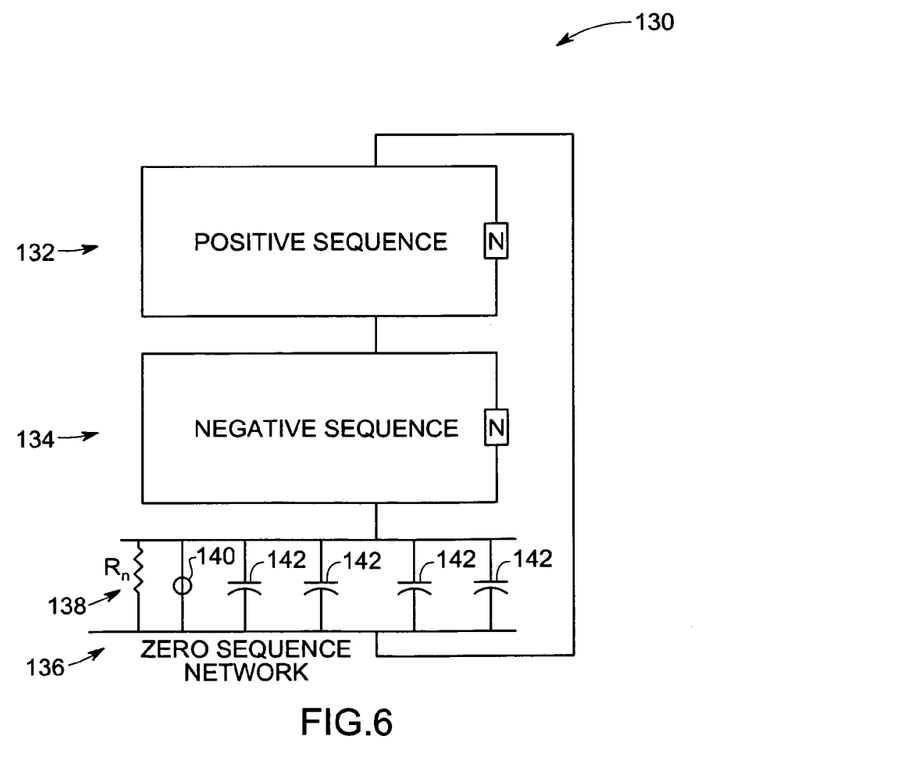
FIG. 6 is a diagrammatical view of a sequence component network at an injection frequency.

FIG. 6 is a diagrammatical illustration of a sequence component network 130 for locating ground faults through the use of a tone signal at an injection frequency. The use of an injection frequency is an alternative to the pulsed approach employing a contactor as described above. The network 130 includes a positive sequence network 132, negative sequence network 134, and a zero sequence network 136. The zero sequence network 136 includes a grounding resistor 138, an injection current source 140, and a plurality of charging capacitances 142. As illustrated, the injection current source 140 is provided to inject a current across the grounding resistor 138. The injection frequency of the current is a frequency other than a frequency of the current distributed by the system. In one embodiment, the injection frequency is at a harmonic frequency of the frequency of current distributed by the system. In another embodiment, the harmonic frequency is a non-integer harmonic frequency. In another embodiment, the injection frequency is at two harmonic frequencies of the frequency of current distributed by the system. In yet another embodiment, the frequency of injection is dual injection frequency such as used in telephone touch-tone dialing.

In operation, the voltage across the zero sequence network 136 at the injection frequency is reduced. As a result, a reduced current flows through the grounding resistor 138, or the charging capacitance and interference effects are reduced. The injection current in the zero sequence network 136 flows from the injection point to the location of the fault. This flow of injection current provides a tracing signal in the zero sequence network 136. A passive filter, such as parallel LC filter may be used to block fundamental high voltages that may be generated across the grounding resistor when a ground fault is detected.

Figure 7:
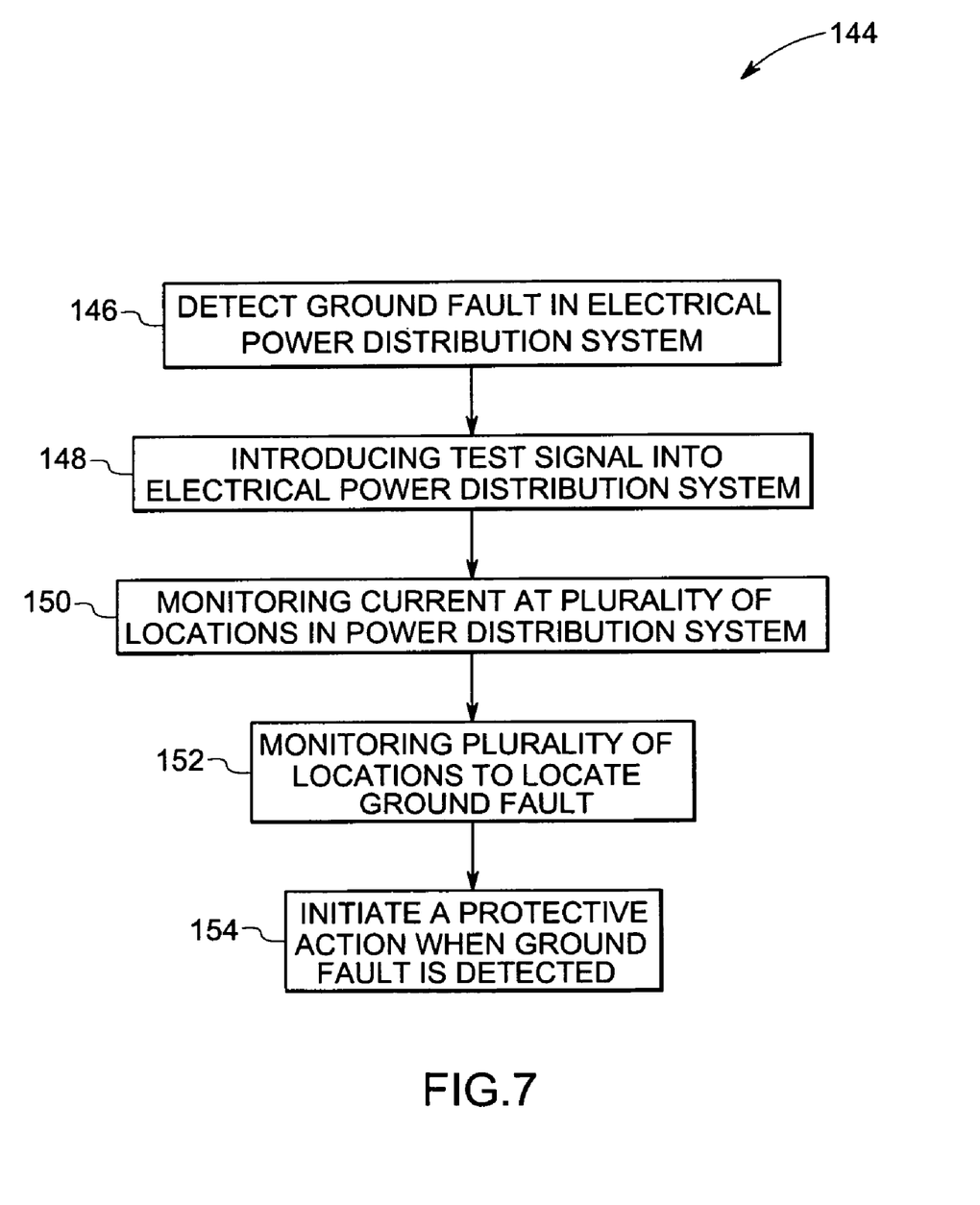
FIG. 7 is a flow chart illustrating exemplary steps involved in locating a ground fault in an electrical power distribution system.

FIG. 7 is a flow chart illustrating exemplary steps involved in locating a ground fault in an electrical power distribution system. The process, designated generally by the reference numeral 144, begins at step 146 in which a ground fault is detected in electrical power distribution system by comparing the lowest phase-to-ground voltage of the system to a basis voltage which is the nominal phase-to-neutral voltage. The phase-to-ground voltages are computed from phase-to-neutral voltages and the neutral-to-ground voltage. If the phase-to-ground voltage is less than the basis voltage, a ground fault is detected in the phase under consideration. At step 148, a test signal is introduced into the power distribution system. In one embodiment, when a ground fault is detected, an alarm is triggered and a neutral grounding resistor of the source transformer is periodically partially shorted. For example, half of the neutral grounding resistance is shorted for 1 second once every 10 seconds. This creates a tracing signal in the power distribution system. In another embodiment, a zero sequence current at a frequency other than the fundamental frequency of current distributed by the system is injected across the neutral grounding resistor to create a tracing signal in the power distribution system. In one example, the frequency of injection is 300 Hertz, so that it is easy to separate the tracing signal from the fundamental frequency current. Only reduced voltage is required to generate the injected current.

At step 150, current at a plurality of locations in the power distribution system are monitored via current sensors. The current sensors transmit detected current signals to the processor. At step 152, the plurality of locations are monitored via the processor. The processor receives the detected current signals and converts the current signals to phasor values. The monitored current values are processed to remove currents resulting from stray capacitance in the distribution system. The ground fault is located by identifying zero sequence current values in phase with voltage across the grounding resistor or out of phase with current through the grounding resistor. In broad sense, the ground fault is located between a location at which the test signal is detected and a downstream location at which the test signal is not detected. At step 154, when a ground fault signal is located, the control unit receives a control signal from the processor and initiates a protective action by triggering the circuit interrupter, contactor or breaker to interrupt the power supply to the faulted phase or initiate an alarm.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method for locating a ground fault in an electrical power distribution system comprising:
   providing a plurality of current sensors at a plurality of locations in the electrical power distribution system;
   detecting a ground fault in the electrical power distribution system;
   monitoring current at the plurality of locations in the electrical power distribution system via the current sensors;
   introducing a test signal into a zero-sequence network of the electrical power distribution system via a test signal generating device; wherein the test signal is a tone signal at a harmonic frequency of the frequency of current distributed by the system; and
   monitoring the plurality of locations to locate the ground fault between a location at which the test signal is detected and a downstream location at which the test signal is not detected.

2. The method of claim 1, wherein the test signal is a pulse signal generated at desired intervals.

3. The method of claim 2, wherein the pulse signal is generated by closing a switch coupled across a portion of a grounding resistor.

4. The method of claim 1, wherein the harmonic frequency is a non integer harmonic frequency.

5. The method of claim 1, wherein the tone signal is at two harmonic frequencies of the frequency of current distributed by the system.

6. The method of claim 1, wherein monitoring the plurality of locations includes detecting current signals and converting current signals to phasor values.

7. A system for locating a ground fault in an electrical power distribution system comprising:
   plurality of current sensors adapted to monitor current at a plurality of locations in the distribution system;
   a test signal generating device configured to introduce a test signal into a zero-sequence network of the distribution system; wherein the test signal is a tone signal at a harmonic frequency of the frequency of current distributed by the system; and
   a processor configured to receive signals from the current sensors to identify a location of the ground fault between a location at which the test signal is detected and a downstream location at which the test signal is not detected.

8. The system of claim 7, wherein the test signal generating device comprises a switch coupled across a portion of a neutral grounding resistor of a substation transformer.

9. The system of claim 7, further comprising a control unit configured to receive a signal from the processor and initiate a protective action when a ground fault is detected in the system.

10. A method for locating a ground fault in an electrical power distribution system comprising:
    providing a plurality of current sensors at a plurality of locations in the electrical power distribution system;
    detecting a ground fault in the electrical power distribution system;
    monitoring current at the plurality of locations in the electrical power distribution system via the current sensors;
    introducing a test signal into the electrical power distribution system via a test signal generating device; and
    monitoring the plurality of locations to locate the ground fault between a location at which the test signal is detected and a downstream location at which the test signal is not detected
    wherein locating the ground fault includes identifying zero sequence current values in phase with voltage across a grounding resistor.

11. The method of claim 10, wherein the test signal is a tone signal at a harmonic frequency of the frequency of current distributed by the system.

12. The method of claim 11, wherein the harmonic frequency is a non integer harmonic frequency.

13. A method for locating a ground fault in an electrical power distribution system comprising:
    providing a plurality of current sensors at a plurality of locations in the electrical power distribution system;
    detecting a ground fault in the electrical power distribution system;
    monitoring current at the plurality of locations in the electrical power distribution system via the current sensors;
    introducing a test signal into the electrical power distribution system via a test signal generating device; and
    monitoring the plurality of locations to locate the ground fault between a location at which the test signal is detected and a downstream location at which the test signal is not detected
    wherein locating the ground fault includes identifying zero sequence current values out of phase with current through a grounding resistor.

14. The method of claim 13, wherein the test signal is a tone signal at a harmonic frequency of the frequency of current distributed by the system.

15. The method of claim 14, wherein the harmonic frequency is a non integer harmonic frequency.

16. A system for locating a ground fault in an electrical power distribution system comprising:
    plurality of current sensors adapted to monitor current at a plurality of locations in the distribution system;
    a test signal generating device configured to introduce a test signal into the distribution system; and a processor configured to receive signals from the current sensors to identify a location of the ground fault between a location at which the test signal is detected and a downstream location at which the test signal is not detected;

wherein locating the ground fault includes identifying zero sequence current values in phase with voltage across a grounding resistor.

17. A system for locating a ground fault in an electrical power distribution system comprising:

plurality of current sensors adapted to monitor current at a plurality of locations in the distribution system;

a test signal generating device configured to introduce a test signal into the distribution system; and a processor configured to receive signals from the current sensors to identify a location of the ground fault between a location at which the test signal is detected and a downstream location at which the test signal is not detected;

wherein locating the ground fault includes identifying zero sequence current values out of phase with current through a grounding resistor.

* * * * *